(12) United States Patent
Derr

(10) Patent No.: US 9,282,663 B2
(45) Date of Patent: Mar. 8, 2016

(54) ELECTRONIC DEVICE HAVING A WATERTIGHT HOUSING

(75) Inventor: Andreas Derr, Schluchsee (DE)

(73) Assignee: Testo AG, Lenzkirch (DE)

( * ) Notice: Subject to any disclaimer, the term of this patent is extended or adjusted under 35 U.S.C. 154(b) by 1427 days.

(21) Appl. No.: 12/924,117

(22) Filed: Sep. 21, 2010

(65) Prior Publication Data

US 2012/0067383 A1    Mar. 22, 2012

(51) Int. Cl.
*A47L 15/42* (2006.01)
*H05K 5/06* (2006.01)
*A47L 15/46* (2006.01)

(52) U.S. Cl.
CPC ............ *H05K 5/068* (2013.01); *A47L 15/4287* (2013.01); *A47L 15/46* (2013.01)

(58) Field of Classification Search
CPC .................................................... G06F 1/1615
See application file for complete search history.

(56) References Cited

U.S. PATENT DOCUMENTS

| 6,068,119 | A | 5/2000 | Derr et al. |
| 6,634,494 | B1 | 10/2003 | Derr et al. |
| 6,665,174 | B1 | 12/2003 | Derr et al. |
| 7,099,147 | B2 | 8/2006 | Derr et al. |
| 7,180,735 | B2 * | 2/2007 | Thomas et al. .......... 361/679.56 |

* cited by examiner

*Primary Examiner* — Jason Ko
(74) *Attorney, Agent, or Firm* — Muirhead and Saturnelli, LLC

(57) ABSTRACT

An electronic device is disclosed. In accordance with one embodiment the electronic device includes a housing that encloses an interior space tightly separating the interior space from an exterior; a gastight flexible membrane arranged such that it divides the interior space into a first and a second volume, the first and the second volume being tightly sealed to each other; and a watertight and gas-permeable membrane coupling the second volume with the exterior of the housing.

13 Claims, 1 Drawing Sheet

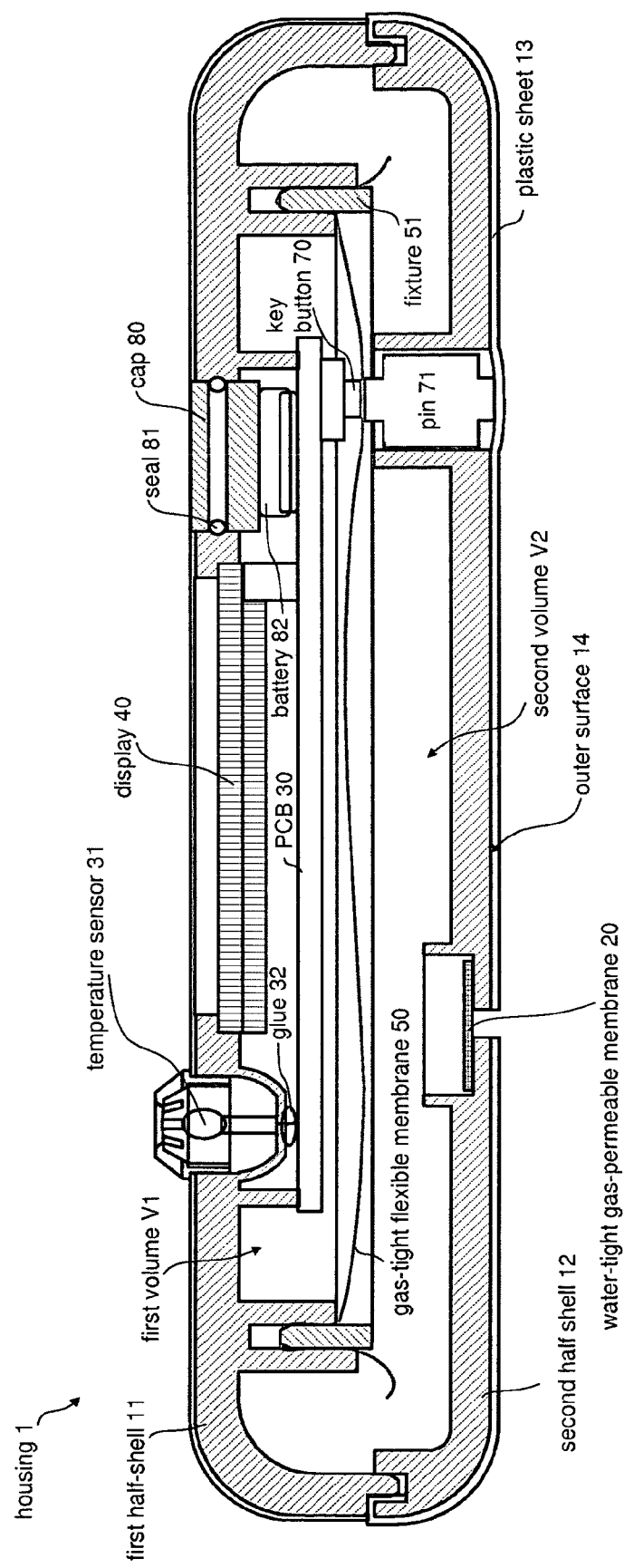

ELECTRONIC DEVICE HAVING A WATERTIGHT HOUSING

TECHNICAL FIELD

This application relates to a sealed housing for providing a tightly sealed encasement for electronic components. In particular, this application relates to dishwasher-proof monitoring device for monitoring the operation of dishwashers.

BACKGROUND

Dishwasher monitoring devices are placed in the interior of a dishwasher in order to monitor the operation of a dishwasher. In particular, temperature profiles and other operational parameters may be monitored and recorded during a washing cycle. Such monitoring devices may generally be employed in professional dishwashing machines for providing information about the washing cycle as well as by manufacturers of dishwashing machines in quality control.

As such monitoring devices operate in the interior of a dishwashing machine, the device requires a tightly sealed encasement for protecting the components residing in the interior of the device from the corrosive influence of hot and humid air, water and water vapour.

In order to comply with the above-mentioned requirements known devices use, for example, sealed housings including a radial seal or welded (i.e. heat sealed) plastic housings in order to provide a watertight and gastight encasement.

A further requirement usually is that the devices allow a mobile and autonomous operation which entails the need for a power supply using batteries. However, battery change is a problem, as the battery compartment also has to by tightly sealed and the seal has to withstand high temperatures and pressure differences.

An insufficient sealing may cause air, when expanding due to a temperature rise during operation of the dishwasher, to leak out of the housing with the result that, after cooling down, the mentioned leakage is reverted and humid air and tiny water drops may intrude into the housing thus promoting corrosion of components (especially of electronic components) residing in the interior of the housing. Especially condensed water forming on printed circuit boards may quickly destroy electronic circuits Consequently there is still a need for a tightly sealed housing which helps to overcome or at least to alleviate the problems discussed above.

SUMMARY

An electronic device is disclosed. In accordance with one example of the system described herein, the electronic device comprises: a housing that encloses an interior space tightly separating the interior space from an exterior; a gastight flexible membrane arranged such that it divides the interior space into a first and a second volume, the first and the second volume being tightly sealed to each other; and a watertight and gas-permeable membrane coupling the second volume with the exterior of the housing.

BRIEF DESCRIPTION OF THE DRAWINGS

The system described herein can be better understood with reference to the following drawings and description. The components in the figures are not necessarily to scale, instead emphasis being placed upon illustrating the principles of the system described herein. Moreover, in the figures, like reference numerals designate corresponding parts. In the drawings:

FIG. 1 is a cross-sectional view of a housing of a dishwasher monitoring device in accordance with one example of the system described herein.

DETAILED DESCRIPTION OF VARIOUS EMBODIMENTS

FIG. 1 is a cross sectional view through a housing 1 of an electronic device in accordance with the system described herein. Accordingly, the electronic device comprises a housing 1 that encloses an interior space tightly separating the interior space from an exterior. The interior space is composed of a first volume V1 and a second volume V2, both volumes V1 and V2 being divided by a gastight flexible membrane 50. The membrane 50 is arranged such that the first and the second volume V1, V2 are tightly sealed to each other. Further the electronic device includes a watertight (waterproof) but gas-permeable membrane 20 that couples the second volume V2 with the exterior of the housing. The membrane covers a corresponding aperture in the wall of the housing thus preventing water from leaking into the second volume, but allowing an exchange of gas between the second volume V2 and the exterior of the housing so that no pressure difference can build up between the atmospheric pressure $p_0$ outside the housing and second volume V2 inside the housing.

The watertight and gastight flexible membrane 50, which separates the first volume V1 from the second volume V2, is flexible to such an extent that air pressure differences between the first and the second volume V1, V2 are immediately compensated by an appropriate deflection of the flexible membrane 50. Consequently, no pressure difference can build up between the atmospheric pressure $p_0$ outside the housing and the first volume V1, too, although the first volume V1 is tightly sealed (gastight and watertight) from its surrounding environment.

Electronic (and other) components which are sensitive to corrosion and thus should not come into contact with humid air, water vapour, etc. are arranged in the tightly sealed first volume V1 whereas the second volume includes only insensitive components (e.g. mechanical components made of plastic or stainless steel). Due to the pressure equalization between the first volume V1, the second volume V2 and the exterior of the housing the seals (O-rings, gaskets, etc) providing a hermetic sealing of the first volume V1 are not loaded by any pressure differences and thus leakage is prevented.

The electronic components arranged in the hermetically sealed first volume V1 are placed on a printed circuit board 30. Additionally an electronic display 40 (e.g. a LCD) may be arranged in the first volume V1, too, and coupled to the printed circuit board 30.

Electric power for operating the display 40 and further electronic circuits arranged on the PCB 30 may by provided by a battery 82 which may also reside within the first volume V1. For example, the battery 82 may be in direct mechanical contact to the PCB 30. Alternatively a separate battery compartment may be provided within the first volume V1. In the example illustrated in FIG. 1 a button cell battery is used. In order to allow for an easy battery replacement (in case of a flat or defective battery) an aperture may be arranged in the housing such that it couples the first volume V1 with the exterior of the housing so as to allow to replace the battery 82 through the aperture. During operation of the electronic device, the aperture is sealed using a cap 80 covering the aperture and sealing ring 81 arranged between the cap 80 and the edge of the aperture in order to provide a gastight and watertight (i.e. a hermetic) sealing of the aperture and thus of the first volume V1.

In order to allow user inputs to the electronic device, at least one key button 70 may be required. The key button 70 may be arranged on the PCB 30 such that it points towards the flexible membrane 50. On the other side of the flexible membrane 50 (i.e. in the second volume V2) a pin 71 may be slidably supported at the housing and mechanically coupled to the key button 70 such that the key button 70 can be operated via the pin 71. In the example of FIG. 1 a sheath guiding the pin 71 is rigidly coupled to the wall of the housing. The pin 71 extends from the key button 70 (separated therefrom by the membrane 50) to an outer surface 14 of the housing 1, so that the key button 70 can be operated from the outside of the housing by pressing the pin 71.

In order to provide a tight sealing of the housing 1, a watertight and gastight plastic sheet 13 covers at least a part of the outer surface 14 of the housing. The sheet 13 may be made of an elastomeric (e.g. a thermoplastic elastomer, short: TPE). In particular the outer end of the pin 71 may be covered by the sheet 13 so that the sheath guiding the pin 71 is sealed. However, the pin 71 can be pressed by pressing onto the sheet material 13. The sheet 13 includes an opening at lease at the position where the gas-permeable membrane 20 is located covering an aperture in the housing as explained above.

In contrast to the sheet 13 the watertight and gas-permeable membrane 20 may be made of a fluoropolymer, for example, of a tetrafluoroethylene (TFE) based polymere such as polytetrafluoroethylene (PTFE, known as Teflon™) or Nafion™. Such membranes are sometimes referred to GORE™ membranes. Further, the flexible membrane 50 may be made of latex (rubber) or any appropriate elastomer.

Dependent on the application one or more sensors may be connected to electronic circuitry on the PCB 30. In the present example a temperature sensor 31 is connected to the PCB 30. The sensitive part of the sensor device is placed outside the housing 1 so as to measure the ambient temperature. The leads of the sensor 31 are passed through the housing and connected to the PCB 30. The passage through the wall of the housing 1 may be sealed with a sealing glue 32.

The geometry of the housing may be chosen dependent on the application. In the example illustrated in FIG. 1 the housing is composed of, inter alia, two half-shells 11, 12. The first volume V1 is tightly enclosed by the first half-shell 11 and the watertight and gastight flexible membrane 50. Both half-shells 11, 12 may be fitted together using a kind of tongue and groove joint.

Electronic devices as illustrated in FIG. 1 and described above can be usefully applied in a hot and wet environment such as in the interior of a dishwasher machine.

In accordance with one example, a dishwasher monitoring device is constructed in accordance with the device illustrated in FIG. 1. In this case the dishwasher monitoring device may include, besides the temperature sensor 31 arranged to measure the ambient temperature, electronic circuitry capable of monitoring and recording the measured temperature data during operation of the dishwasher.

Although the system set forth herein and its advantages have been described in detail, it should be understood that various changes, substitutions, and alterations can be made herein without departing from the spirit and scope of the invention as defined by the appended claims.

Moreover, the scope of the present application is not intended to be limited to the particular embodiments of the process, machine, manufacture, composition of matter, means, methods, and steps described in the specification. As one of ordinary skill in the art will readily appreciate from the disclosure of the system described herein, processes, machines, manufacture, compositions of matter, means, methods, or steps, presently existing or later to be developed, that perform substantially the same function or achieve substantially the same result as the corresponding embodiments described herein may be utilized according to the present invention. It is intended that the specification and examples be considered as exemplary only. Accordingly, the appended claims are intended to include within their scope such processes, machines, manufacture, compositions of matter, means, methods, or steps.

The invention claimed is:

1. An electronic device comprising:
a housing that encloses an interior space tightly separating the interior space from an exterior;
a first volume formed inside the housing and sealed against gas and water from the exterior of the housing;
a second volume formed inside the housing, the second volume being separate from the first volume to prevent gas and water from passing therebetween;
a watertight and gastight flexible membrane arranged to form a shared wall between the first and the second volume;
a watertight and gas-permeable membrane that couples the second volume with the exterior of the housing; and
a circuit board that carries electronic components, the circuit board being arranged in the first volume.

2. The electronic device of claim 1 further comprising:
an electronic display arranged in the first volume and coupled to the printed circuit board.

3. The electronic device of claim 1 further comprising:
an aperture arranged in the housing that couples the first volume with the exterior of the housing;
a cap that seals the aperture; and
a seal arranged between the cap and the aperture to provide a gastight and watertight sealing of the aperture.

4. The electronic device of claim 3 further comprising:
a battery compartment that is arranged in the first volume, the battery compartment being accessible from the exterior via the aperture in the housing.

5. The electronic device of claim 1 further comprising:
a key button arranged on the printed circuit board in the first volume;
a pin slidably arranged in the second volume and mechanically coupled to the key button via the watertight and gastight flexible membrane to allow the key button to be operated via the pin.

6. The electronic device of claim 5 further comprising:
a sheath rigidly connected to the housing in the second volume, wherein the pin extends to an outer surface of the housing and is guided in the sheath.

7. The electronic device of claim 6 further comprising:
a watertight and gastight sheet at one end of the pin and covering at least a part of the outer surface of the housing.

8. The electronic device of claim 1, wherein the watertight and gastight flexible membrane is flexible to compensate for air pressure differences between the first and the second volume.

9. The electronic device of claim 1, in which the watertight and gastight flexible membrane is made of latex or an elastomer.

10. The electronic device of claim 1, in which watertight and gas-permeable membrane is made of a fluoropolymer.

11. The electronic device of claim 1, wherein the housing includes two half-shells, and wherein the first volume is tightly enclosed by one half-shell and the watertight and gastight flexible membrane.

12. A dishwasher monitoring device comprising:
- a housing that encloses an interior space tightly separating the interior space from an exterior space corresponding to an interior of a dishwasher;
- a first volume formed inside the housing and sealed against gas and water from the exterior of the housing;
- a second volume formed inside the housing, the second volume being separate from the first volume to prevent gas and water from passing therebetween;
- a watertight and gastight flexible membrane arranged to form a shared wall between the first and the second volume; and
- a watertight and gas-permeable membrane that couples the second volume with the exterior of the housing; and
- a circuit board that carries electronic components, the circuit board being arranged in the first volume.

13. The dishwasher monitoring device of claim 12 further comprising:
- a temperature sensor arranged to measure the temperature on an outer surface of the housing; and
- circuitry that monitors and records the measured temperature data during operation of the dishwasher.

* * * * *